(12) United States Patent
Takemura

(10) Patent No.: US 11,462,385 B2
(45) Date of Patent: Oct. 4, 2022

(54) ION BEAM IRRADIATION APPARATUS AND PROGRAM THEREFOR

(71) Applicant: NISSIN ION EQUIPMENT CO., LTD., Koga (JP)

(72) Inventor: Shinya Takemura, Shiga (JP)

(73) Assignee: NISSIN ION EQUIPMENT CO., LTD., Koka (JP)

(*) Notice: Subject to any disclaimer, the term of this patent is extended or adjusted under 35 U.S.C. 154(b) by 409 days.

(21) Appl. No.: 16/801,689

(22) Filed: Feb. 26, 2020

(65) Prior Publication Data

US 2020/0312616 A1 Oct. 1, 2020

(30) Foreign Application Priority Data

Mar. 25, 2019 (JP) .............................. JP2019-057092
Oct. 28, 2019 (JP) .............................. JP2019-194959

(51) Int. Cl.
*H01J 37/302* (2006.01)
*H01J 37/08* (2006.01)
*G06N 20/00* (2019.01)
*G06N 5/04* (2006.01)

(52) U.S. Cl.
CPC ............ *H01J 37/3023* (2013.01); *G06N 5/04* (2013.01); *G06N 20/00* (2019.01); *H01J 37/08* (2013.01); *H01J 2237/30411* (2013.01)

(58) Field of Classification Search
CPC ..... H01J 37/30253; H01J 37/08; G06N 20/00
See application file for complete search history.

(56) References Cited

U.S. PATENT DOCUMENTS

2021/0104375 A1* 4/2021 Geurts ................ H01J 37/3005

FOREIGN PATENT DOCUMENTS

JP 2007-035370 A 2/2007

\* cited by examiner

*Primary Examiner* — Joseph L Williams
(74) *Attorney, Agent, or Firm* — Sughrue Mion, PLLC

(57) ABSTRACT

An ion beam irradiation apparatus includes modules for generating an ion beam meeting a processing condition, and a machine learning part that generates a learning algorithm using, as an explanatory variable, a processing condition during new processing and a monitored value that indicates a state of a module during a last processing immediately before the new processing, and a basic operation parameter output part that uses the learning algorithm to output an initial value of a basic operation parameter for controlling an operation of the module.

9 Claims, 6 Drawing Sheets

ION BEAM IRRADIATION APPARATUS AND PROGRAM THEREFOR

CROSS-REFERENCE TO RELATED APPLICATION

This application claims priority from Japanese Patent Application No. 2019-057092, filed in the Japanese Patent Office on Mar. 25, 2019, and Japanese Patent Application No. 2019-194959, filed in the Japanese Patent Office on Oct. 28, 2019, the entire contents of each of which are herein incorporated by reference in their entireties.

BACKGROUND

1. Field

The present disclosure relates to an ion beam irradiation apparatus and a program therefor.

2. Description of Related Art

An ion implantation apparatus is equipped with a plurality of modules for generating an ion beam, and each module typically is set up based on various preliminarily set basic operation parameters. .

Typically, an initial value is preliminarily stored in a memory according to a recipe for the processing, or a value used during a previous set up under the same recipe is used as an initial value in a later set up procedure.

However, there is a disadvantage in that, if a state of a module changes due to degradation or maintenance such that the state is different from the previous processing, a setup time period to obtain the adjusted value can be extended, or the quality of an ion beam can be changed, even when the same recipe is used to in the set up procedure and a same value is input as the initial value.

SUMMARY

It is an aspect to make it possible to adequately determine an initial value in a set up procedure for a module to allow a setup time period to be shortened, or to allow a desired ion beam to be generated.

According to an aspect of one or more embodiments, there is provided an ion beam irradiation apparatus comprising a plurality of modules for generating an ion beam meeting a processing condition; a memory storing program code; and at least one central processing unit (CPU) which accesses the memory to read the program code and execute the program code to operation as a machine learning part that generates a learning algorithm using, as an explanatory variable, a processing condition during new processing and a monitored value that indicates a state of at least one of the modules during a last processing immediately before the new processing; and a basic operation parameter output part that uses the learning algorithm to output an initial value of a basic operation parameter for controlling an operation of the at least one of the modules.

According to another aspect of one or more embodiments, there is provided a computer readable storage medium storing program code for operating the ion beam irradiation apparatus as the machine learning part and the basic operation parameter output part.

BRIEF DESCRIPTION OF THE DRAWINGS

The above and/or other aspects will become apparent and more readily appreciated from the following description of embodiments, taken in conjunction with the accompanying drawings of which.

DETAILED DESCRIPTION

Figure 1:
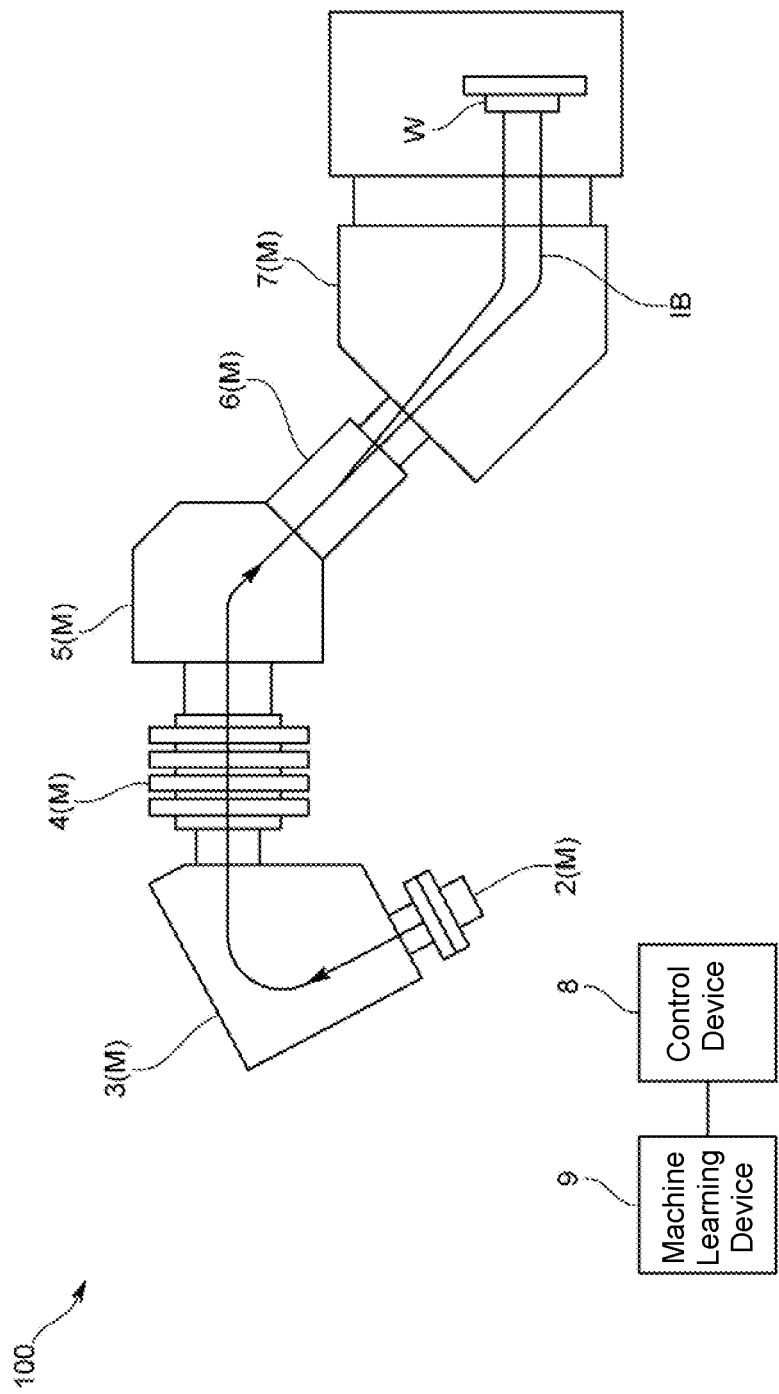
FIG. 1 is a schematic diagram showing a configuration of an ion beam irradiation apparatus according to an embodiment.

An ion implantation apparatus is equipped with a plurality of modules for generating an ion beam, such as an ion source and a mass separation magnet. Each module is configured or set up to operate based on various preliminarily-set basic operation parameters, as disclosed in, for example, JP 2007-035370A.

Specifically, according to a "recipe", an initial value of one or more basic operation parameters is input to each of the modules, the apparatus is operated using the initial value, and information regarding an ion beam generated using the initial value is detected and the initial value is adjusted so as to allow the ion beam to be generated in conformity to the recipe, thereby setting up the module.

As an initial value of the one or more basic operation parameters, a value preliminarily stored in a memory or the like may be input according to each recipe, or a value used during previous processing under the same recipe may be input.

However, if a state of a module changes due to degradation of the module over time, or a maintenance state of the module, such that the state is different from the previous processing, a setup time period to obtain the adjusted value can be extended, or the quality of an ion beam such as a beam current amplitude, a beam angle and a beam current density can be changed, even in a situation where the same recipe is used, and the same value is input as the initial value.

According to various embodiments disclosed herein, an ion beam irradiation apparatus includes a machine learning part that generates a learning algorithm using, as an explanatory variable, a processing condition during new processing and a monitored value indicative of a state of a module during processing immediately before the new processing and an output part that uses the learning algorithm to output an initial value of a basic operation parameter for controlling an operation of the module.

In the ion beam irradiation apparatus according to various embodiments, a learning algorithm using, as an explanatory variable, a monitored value indicative of a state of a module during processing immediately before the new processing (hereinafter referred to as "last processing") is generated, so that an initial value of a basic operation parameter to be output using this learning algorithm is set in consideration of the state of at least one of the modules, just before entering the new processing. Thus, the use of the learning algorithm makes it possible to adequately determine an initial value of each basic operation parameter appropriate to a current module state, such as an initial value allowing a setup time period to be shortened, or an initial value allowing a desired ion beam to be generated.

The initial value may be input to a respective one of the modules, and the respective one of the modules may be operated based on an adjusted value obtained by adjusting the initial value, and the ion beam irradiation apparatus may further include a learning data storage part to store therein learning data obtained from a plurality of previous processings. The learning data may include a plurality of data sets in each of which the processing condition in each of the processings, at least one of the initial value and the adjusted value for the respective one of the modules in each of the processings, the monitored value of the at least one module during processing just before each of the processings, and an actual value of a given objective variable in each of the processings are associated with each other, and the machine learning part may operable to generate the learning algorithm through machine learning using the learning data.

Examples of the explanatory variable may include a setup time period until the adjusted value is obtained; an index value indicative of whether or not the adjusted value is obtained; a beam current amplitude of the ion beam; a beam angle of the ion beam; and/or a beam current density of the ion beam. In some contexts, the term "explanatory variable" may be alternatively be referred to as a training variable or input data that is used to train an artificial intelligence (AI) engine (see FIG. 6), as discussed further below. Further, the explanatory variable may be changed depending on the objective variable.

Among the plurality of modules, an ion source system-module is often short in terms of usable life, as compared to an extraction electrode system-module and a beam line electromagnetic field system-module, which means that the ion source system-module is high in terms of maintenance or exchange frequency, as compared to the extraction electrode system-module and the beam line electromagnetic field system-module. In view of this, the learning data may include a monitored value of at least the ion source system-module. In this case, the machine learning can be performed in consideration of a state of the last processing in the ion source system-module whose state is most likely to change among the modules, so that it is possible to more adequately determine the initial value during new processing.

Plasma which is generated in an ion source involves difficulty in modeling and in control. Examples of a parameter having a dominant influence on efficiency of plasma generation include a flow rate of gas to be supplied to a plasma chamber constituting the ion source module, and a supply current to be supplied to a source magnet for generating a magnetic field inside the plasma chamber. Therefore, as the basic operation parameter, it may be advantageous to use at least one of a flow rate of a gas to be supplied to the plasma chamber constituting the ion source module, and a supply current to be supplied to the source magnet for generating a magnetic field inside the plasma chamber. This makes it possible to adequately determine respective initial values of the gas flow rate and the supply current to the source magnet, so as to efficiently generate plasma.

The ion beam irradiation apparatus may further include a control device operable, based on the processing condition and a given setup sequence, to select the initial value of the basic operation parameter, input the selected initial value to the respective one of the modules, and adjust the input initial value, thereby setting up the respective one of the modules, and a recovery part to, when the setup of the respective one of the modules by the control device fails to be completed, acquire an abnormal signal indicative of that fact, wherein the ion beam irradiation apparatus is configured such that, in response to a situation where the recovery part acquires the abnormal signal, the initial value of the basic operation parameter output from the basic operation parameter output part is input to the respective one of the modules.

According to this feature, it is possible to use the initial value obtained through the learning algorithm, without largely modifying an existing module setup sequence, and achieve further shortening of the setup time period and further improvement in setup success rate.

The ion beam irradiation apparatus may further include a control device operable, based on the processing condition and a given setup sequence, to select the initial value of the basic operation parameter, input the selected initial value to the respective one of the modules, and adjust the input initial value, thereby setting up the respective one of the modules, and an advance prediction part to, when using the initial value selected based on the processing condition and the setup sequence, predict whether or not the setup of the respective one of the modules will be completed, wherein the ion beam irradiation apparatus is configured such that, in response to a situation where the advance prediction part predicts that the setup of the respective one of the modules will not be completed, the initial value of the basic operation parameter output from the basic operation parameter output part is input to the respective one of the modules.

There may also be provided a computer readable storage medium storing program code for use in an ion beam irradiation apparatus for generating an ion beam meeting a processing condition by a plurality of modules and irradiating a workpiece with the ion beam. The program code when executed by a computer, such as a central processing unit (CPU) or a microprocessor, may perform the functions of a machine learning part to generate a learning algorithm using, as an explanatory variable, at least a processing condition during new processing and a monitored value indicative of a state of at least one of the modules during processing just before the new processing, and an output part to use the learning algorithm to output an initial value of each basic operation parameter for controlling an operation of a respective one of the modules.

According to various embodiments disclosed herein, it is possible to perform machine learning in consideration of the state of at least one of the modules during a last processing, and thus adequately determine an initial value of each basic operation parameter during new processing, according to an explanatory variable.

With reference to the drawings, various embodiments will now be described. In this specification, the phrase "at least one of A or B" includes "only A", "only B", and "both A and B".

FIG. 1 is a schematic diagram showing a configuration of an ion beam irradiation apparatus according to an embodiment. An ion beam irradiation apparatus 100 is an ion implantation apparatus for irradiating a target W with an ion beam IB to implant ions into the target W. The ion beam irradiation apparatus 100 includes a plurality of modules which are used for generating the ion beam IB. The plurality of modules may include an ion source 2, a mass separation magnet 3, an acceleration tube 4, an energy separation magnet 5, a scanning magnet 6, and a beam parallelizing magnet 7, and a control device 8 for controlling operations of the modules 2 to 7, as shown in FIG. 1. The ion beam irradiation apparatus 100 is illustrated in FIG. 1 but embodiments are not limited an ion implantation apparatus. For example, in some embodiments, the apparatus may be an ion beam etching apparatus.

Specifically, the ion beam irradiation apparatus 100 may include the ion source 2 from which the ion beam IB is extracted, the mass separation magnet 3 provided downstream of the ion source 2 to serve as a mass separator that sorts out, from the ion beam IB extracted from the ion source 2, desired dopant ions identified by a mass number and a valence, and outputs the sorted dopant ions. The ion beam irradiation apparatus 100 may further comprise an acceleration tube 4 provided downstream of the mass separation magnet 3 to accelerate or decelerate the ion beam IB output from the mass separation magnet 3, the energy separation magnet 5 provided downstream of the acceleration tube 4 to serve as an energy separator that sorts out ions having a specific energy from the ion beam IB output from the acceleration tube 4, and outputs the sorted ions, the scanning magnet 6 provided downstream of the energy separation magnet 5 to scan the ion beam IB output from the energy separation magnet 5, magnetically and one-dimensionally (in a direction along the drawing sheet in FIG. 1), and the beam parallelizing magnet 7 provided downstream of the scanning magnet 6 to bend back the ion beam IB output from the scanning magnet 6 so as to become parallel to a reference axis, thereby performing parallel scanning of the ion beam IB in cooperation with the scanning magnet 6. In this specification, each of the above components will be referred to as "module" (hereinafter written as "module M").

The ion beam irradiation apparatus 100 illustrated in FIG. 1 is an example, and in some embodiments, one or more of the modules M may be omitted. For example, in a case where the ion beam irradiation apparatus 100 is configured to irradiate the target W with a ribbon beam having a size greater than that of the target W, in a direction orthogonal to a mechanical scanning direction of the target W, the scanning magnet 6 may be omitted, and one or more of the remaining modules M such as the acceleration tube 4, the energy separation magnet 5 and the beam parallelizing magnet 7 may be appropriately used.

Figure 2:
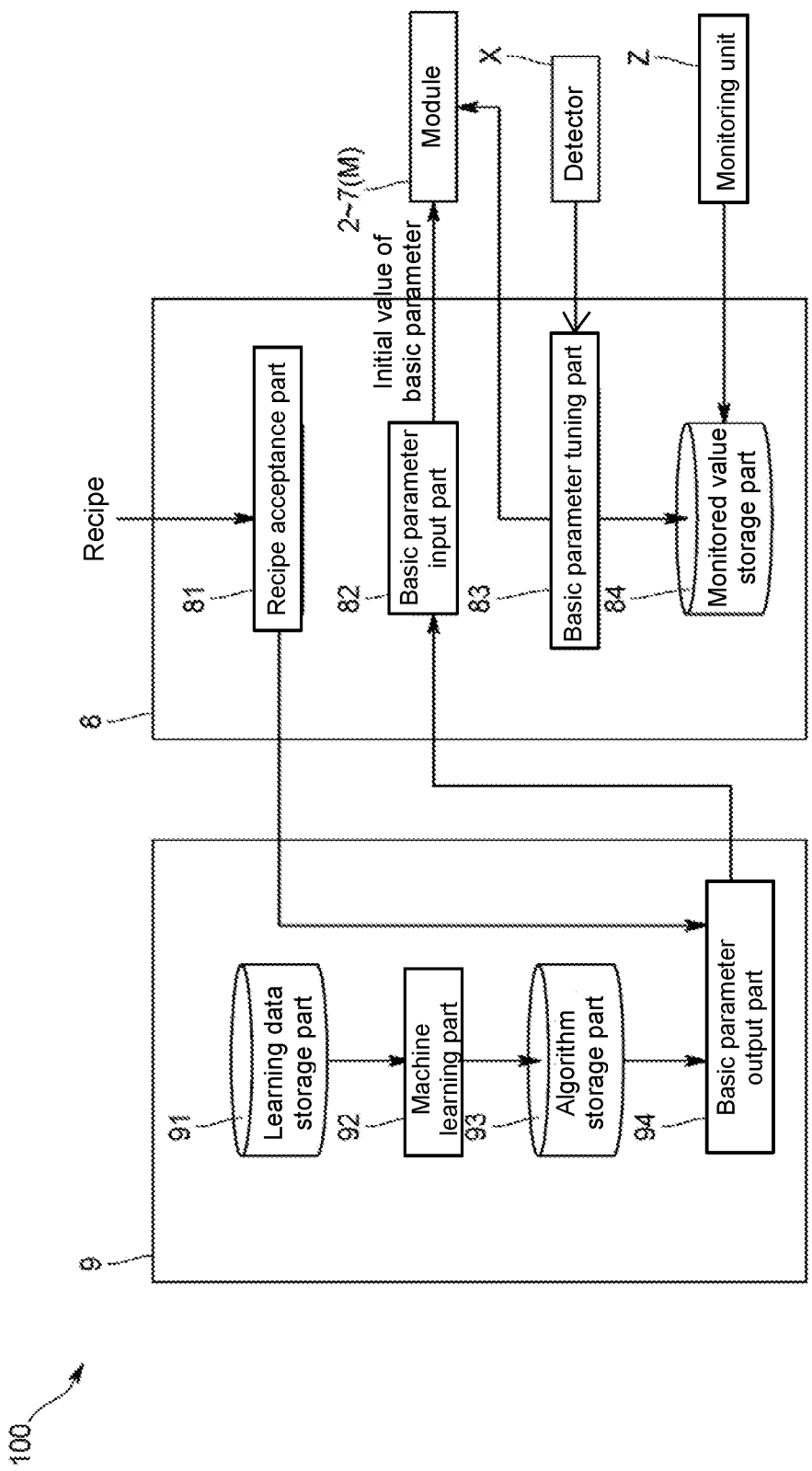
FIG. 2 is a functional block diagram showing functions of a control device and a machine learning device, according to an embodiment.

FIG. 2 is a functional block diagram showing functions of a control device and a machine learning device, according to an embodiment.

The control device 8 is a computer comprising at least one CPU, a memory, a display, and input means, such as a keyboard, mouse, trackpad, touch screen display, etc., and is configured to, when the CPU and its peripherals are cooperatively operated according to control program code stored in the memory, execute the control program code to function as a recipe acceptance part 81, a basic operation parameter input part 82 (hereinafter referred to simply as "basic parameter input part 82"), and a basic operation parameter tuning part 83 (hereinafter referred to simply as "basic parameter tuning part 83"), as shown in FIG. 2.

The recipe acceptance part 81 accepts a processing condition for processing to a workpiece (i.e., a to-be-processed object). In this specification, the processing condition will hereinafter be referred to as "recipe".

The recipe is data which is transmitted from, e.g., a host computer or the like (not shown), and which includes a variety of information indicative of the quality of the ion beam IB generated by the ion beam irradiation apparatus 100 such as an ion species of dopant ions included in the ion beam IB, a beam energy of the ion beam IB, and/or a beam current of the ion beam IB.

The basic parameter input part 82 is operable to input an initial value of each basic operation parameter (hereinafter referred to as "basic parameter") for controlling an operation of a respective one of the modules M, to the respective one of the modules M. Here, the basic parameter refers to a setting item used to control an operation of the respective one of the modules M, and is preliminarily set with respect to the respective one of the modules M. One kind of basic parameter may be set with respect to each of the modules M, or a plurality of types of basic parameters may be set with respect to each of the modules M. In other words, for each module M, there may be one basic parameter or a plurality of basic parameters, and each basic parameter may have an initial value.

The modules M constituting the ion beam irradiation apparatus 100 may be roughly classified into an ion source system-module that generates plasma, an extraction electrode system-module that extracts the ion beam IB from the ion source 2, and a beam line electromagnetic field system-module that controls the extracted ion beam IB.

Examples of the ion source system-module may include a plasma chamber constituting the ion source 2; a gas supply mechanism (e.g., a flow rate control device, etc.) that supplies a plasma generating gas to the plasma chamber; a source magnet that forms a magnetic field inside the plasma chamber; and a filament that emits electrons into the plasma chamber.

Further, examples of the basic parameter set for the ion source system-module may include a flow rate of gas to be supplied to the plasma chamber; a supply current to be supplied to the source magnet; and/or an arc current.

Examples of the extraction electrode system-module may include a suppression electrode and a ground electrode constituting an extraction electrode system that extracts the ion beam IB from the ion source 2; and an adjustment mechanism that adjusts positions of these electrodes, such as an inter-electrode distance thereof, etc.

Further, examples of the basic parameter set for the extraction electrode system-module may include a distance from the plasma chamber to each of the electrodes along a beam extraction direction; a position of each of the electrodes; and/or an inclination of each of the electrodes.

Example of the beam line electromagnetic field system-module may include the mass separation magnet 3, the acceleration tube 4, the energy separation magnet 5, the scanning magnet 6, and/or the beam parallelizing magnet 7.

Further, examples of the basic parameter set for the beam line electromagnetic field system-module may include a magnetic flux density of the mass separation magnet 3, a voltage to be applied to the acceleration tube 4, a magnetic flux density of the energy separation magnet 5, and/or a magnetic flux density of the beam parallelizing magnet 7.

The basic parameters enumerated above are not always entirely necessary, and in some embodiments, some of the basic parameters may be omitted. That is, the basic parameters may be appropriately shifted, according to the configuration of the ion beam irradiation apparatus 100, or the like.

The basic parameter tuning part 83 is operable to adjust (tune) the initial value of each basic parameter input to the basic parameter input part 82. Specifically, the basic parameter tuning part 83 may adjust the initial value of each of one or more basic parameters on a case-by-case basis so as to allow a generated ion beam IB to meet a processing condition, i.e., so as to allow an ion beam IB to be generated in conformity to the recipe, thereby setting up the respective one of the modules M.

More specifically, the basic parameter tuning part 83 is configured to adjust the basic parameter in accordance with a preliminarily set setup sequence. Then, each of the modules M is operated based on an adjusted value of the basic parameter finally obtained through the setup sequence. As used in this specification, the adjusted value includes a value obtained by adjusting the initial value, and the initial value which has not been adjusted.

For example, the setup sequence may include a plurality of steps. According to an embodiment, the setup sequence may include a plasma generation step of generating plasma inside the plasma chamber; an extraction step of extracting an ion beam IB by the extraction electrode system; a beam adjustment step of performing acceleration/deceleration and trajectory adjustment of the ion beam IB; and a beam measurement step of measuring a beam current magnitude, a beam angle, a beam current density or the like of the ion beam IB. As shown in FIG. 2, one or more detectors X, such as a beam detector (e.g., a Faraday cup), may be provided to detect various detection values of the ion beam IB. These detected values are then fed back to the basic parameter tuning part 83. The basic parameter tuning part 83 is operable to feedback-control the value of the basic parameter such that a detection value detected in each step by each of various detectors X such as a beam detector (e.g., Faraday cup) comes close to a given target value.

As shown in FIG. 2, the ion beam irradiation apparatus 100 may further include a monitored value storage part 84 that stores a value of a state parameter indicative of the state of at least one of the modules M (this value will hereinafter be referred to as "monitored value").

Here, even in a situation where the same recipe is received and used, and the same value is input as the initial value of the basic parameter, the adjusted value obtained by the basic parameter tuning part 83 may vary depending on the state of the at least one module M at that time. In this embodiment, the state parameter may include all or a portion of the basic parameters, and the monitored value may include all or a portion of the adjusted values of the basic parameters. Specifically, all or a portion of the adjusted values obtained by the basic parameter tuning part 83 may be stored as the monitored values in the monitored value storage part 84.

Further, other than the basic parameters, the state parameter may include a parameter varying during processing, i.e., a parameter having a difference before and after one or more processing cycles. Examples of this type of state parameter include a filament current and a filament voltage. Differently from the basic parameter whose initial value is input, the state parameter is a variable which varies. For example, in the case of a filament, the state parameter is a variable which varies due to a temporal change in the state of the filament during processing (e.g., a decrease in diameter of the filament). Such a variable (e.g., the diameter of the filament) may be monitored by a monitoring unit Z, and stored as a monitored value in the monitored value storage part 84, as shown in FIG. 2.

Returning to FIG. 1, the ion beam irradiation apparatus 100 may further include a machine learning device 9 that automatically determines the initial value of each basic parameter to be input by the basic parameter input part 82.

The machine learning device 9 is a computer comprising at least one CPU, a memory, a display, input means, such as a keyboard, mouse, trackpad, touch screen display, etc., and an artificial intelligence feature. In some embodiments, the machine learning device 9 may be provided separately from the control device 8, and configured to, when the CPU of the machine learning device 9 and its peripherals are cooperatively operated according to machine learning program code stored in the memory of the machine learning device 9, execute the machine learning program code to perform functions of a learning data storage part 91, a machine learning part 92, an algorithm storage part 93, and a basic operation parameter output part 94 (hereinafter referred to as "basic parameter output part 94"), as shown in FIG. 2. These parts 91-94 will be described in more detail below.

Figure 3:
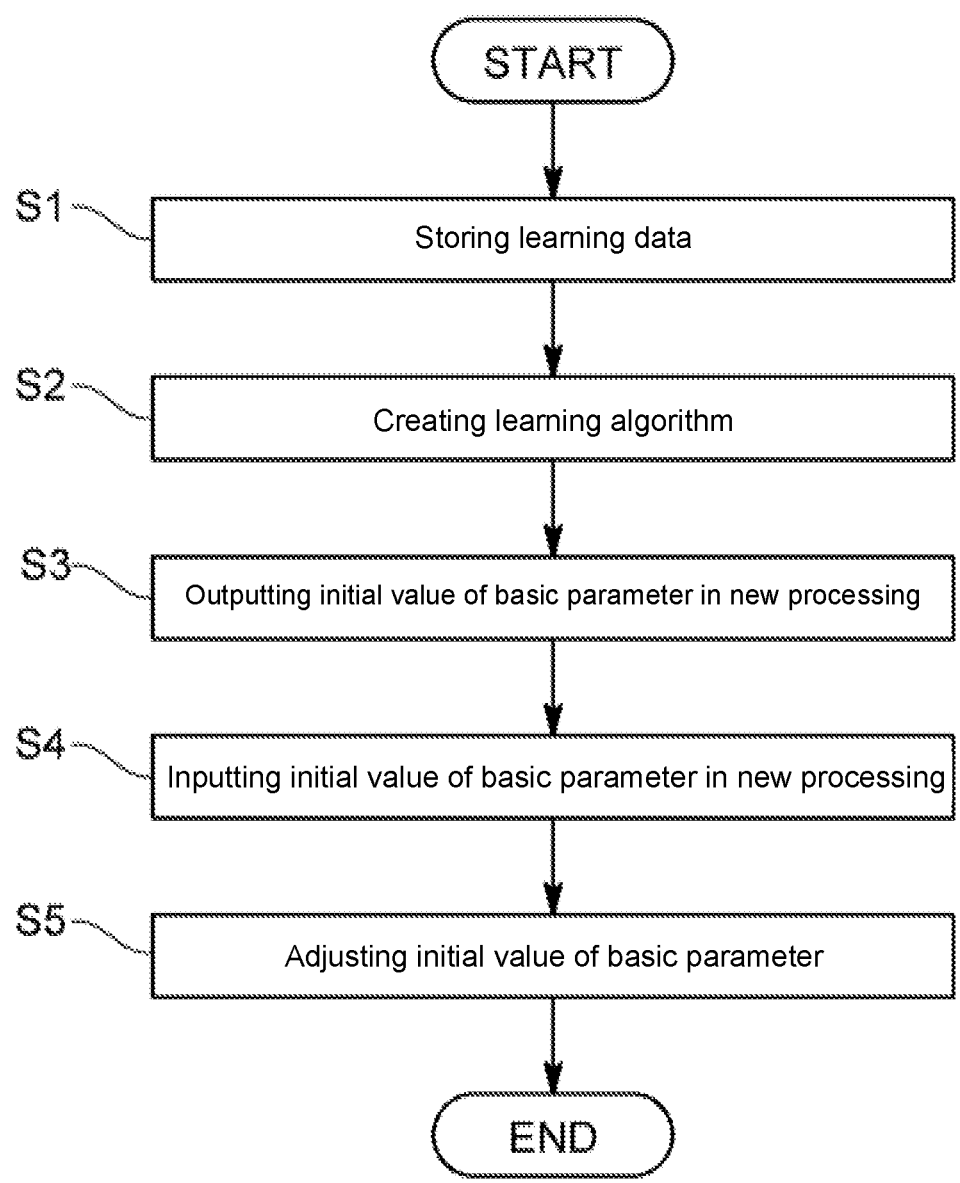
FIG. 3 is a flowchart showing operations of the control device and the machine learning device, according to an embodiment.
Figure 4:
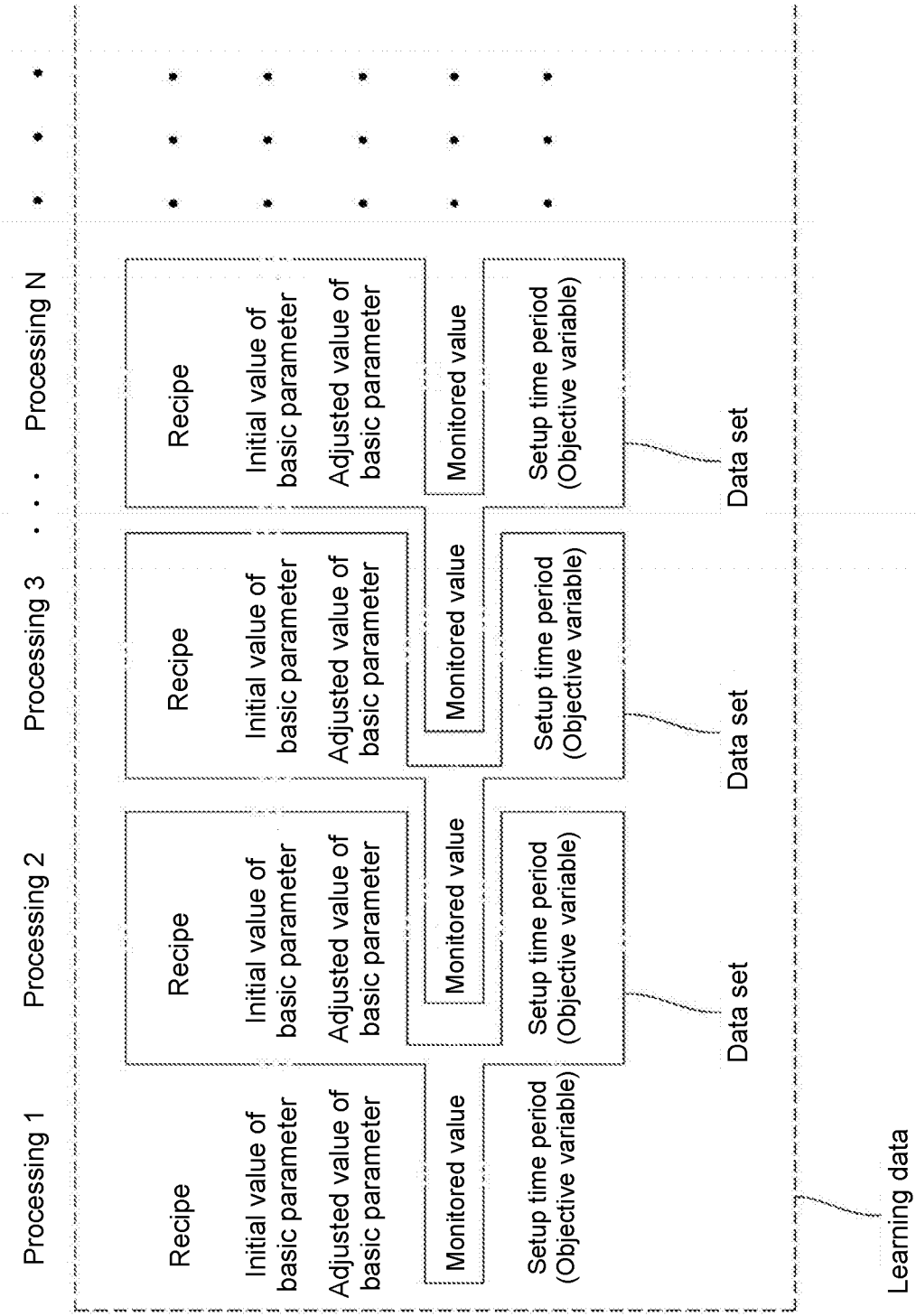
FIG. 4 is a diagram illustrating contents of learning data, according to an embodiment.
Figure 6:
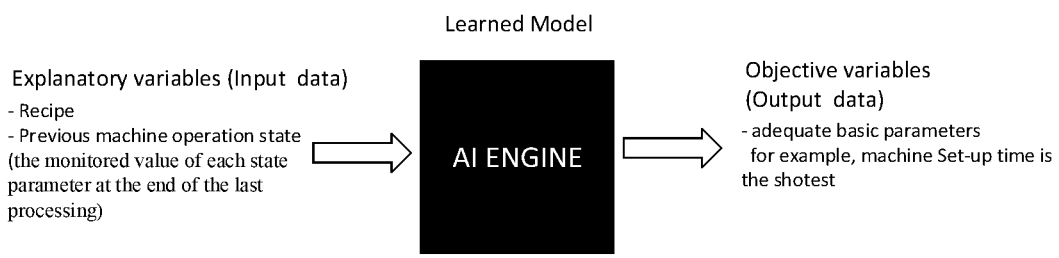
FIG. 6 is an explanatory diagram of an example of an artificial intelligence engine according to embodiments.

FIG. 3 is a flowchart showing operations of the control device and the machine learning device, according to an embodiment. FIG. 4 is a diagram illustrating contents of training data, according to an embodiment. FIG. 6 is an explanatory diagram of an example of an artificial intelligence engine according to embodiments.

With reference to the flowchart in FIG. 3 and the diagrams of FIGS. 4 and 6, setup of each module M using the machine learning device 9 will be described below, with reference to the functions of the parts 91 to 94.

Learning data for use in machine learning is stored in the learning data storage part 91 (S1).

For example, the learning data may be data obtained from a plurality of previous processings (e.g., Processing 1, Processing 2, Processing 3, Processing N in FIG. 4), and includes various actual values used in the plurality of previous processings. Specifically, as shown in FIG. 4, the learning data includes a plurality of data sets, each of which includes the recipe used in the processing, the initial value of each basic parameter input to a respective one of the modules M by the basic parameter input part 82 in the processing, the adjusted value of each basic parameter obtained through the adjustment by the basic parameter tuning part 83 in the processing, the monitored value of each state parameter of at least one of the modules M at the end of the processing, and an actual value of a given objective variable (i.e., a variable that is measured) in the processing, and in each data set, the recipe, initial value(s), adjusted value(s), monitored value(s), and objective variable are associated with each other. In a specific example, when Processing1) is performed (i.e., a very first Processing according to the first use of the recipe), the monitored value has no value. The monitored value in Processing1 is then used for Processing2 to determine adequate parameters for machine operation, as indicated by a block "Data set" in FIG. 4. As shown in FIG. 4, Processing 2 includes the recipe used in the Processing 2, the initial value of each basic parameter input to a respective one of the modules M in the Processing 2, the adjusted value of each basic parameter adjusted in the Processing 2, the monitored value of each state parameter of at least one of the modules M at the end of the Processing 1, and the actual value of the objective variable measured in the Processing 2. In other words, the monitored value in Processing 1 is used for Processing 2, as a part of data set for Processing 2. It should be noted here that the monitored value includes all or a portion of the adjusted values of the basic parameters, and further includes the variable monitored by the monitoring unit Z, as mentioned above. However, the monitored value is usable as long as the monitored value includes at least one of the adjusted values of each basic parameter and the variable monitored by the monitoring unit Z.

Then, among the plurality of pieces of data, in each of the processings, the processing condition (recipe), at least one of the initial value and the adjusted value of each basic parameter, the monitored value of the at least one module M in processing just before the processing (this processing will hereinafter be referred to as a "last processing"), and the actual value of the given objective variable, are associated with each other to form one data set, as shown by the boxes in FIG. 4. In the example illustrated in FIG. 4, the data set comprises both the initial value and the adjusted value of each basic parameter. Further, the data set as shown in FIG.4 is not limited to this. For example, in some embodiments, in each of the processings, e.g., Processing 1 to Processing N, the data set may include other parameters for an explanatory variable such as a degree of vacuum in an ion beam path between an ion source and a chamber in which a target W is placed. The learning data includes a plurality of such data sets.

The objective variable provides a basis for allowing the basic parameter output part 94 to output the initial value of each basic parameter for a new processing. In some embodiments, the objective variable may be a setup time period, i.e., a time period for starting new processing, and includes a tuning time period at least after the basic parameter tuning part 83 starts to adjust the initial value of each basic parameter and before the basic parameter tuning part 83 obtains the adjusted value thereof. That is, the setup time period may be a time from a time the basic parameter tuning part 83 sets the initial value to a time at which an adjustment of the initial value is finished.

The machine learning part 92 operates to create a learning algorithm (S2). For example, the machine learning part 92 operates to generate a learning algorithm using, as an explanatory variable, at least a recipe accepted during new processing and a monitored value of the at least one of the modules M during a last processing just before the new processing, using the learning data stored in the learning data storage part 91. The learning model may be referred to as an artificial intelligence (AI) engine, as shown in FIG. 6.

The machine learning part 92 is a function brought out by the aforementioned artificial intelligence feature, and is configured to generate the above learning algorithm, based on supervised learning, unsupervised learning, reinforcement learning or deep learning, etc.

The machine learning part 92 operates to store the generated learning algorithm in the algorithm storage part 93 set in a given region of the memory of the machine learning device 9. In some embodiments, the algorithm storage part 93 may be provided in an external memory, a crowd server or the like.

The initial value of the basic parameter in the new processing is output (S3). For example, when the recipe acceptance part 81 operates to accept a recipe during new processing, the basic parameter output part 94 operates to use the learning algorithm generated by the machine learning part 92 to output the initial value of each basic parameter during the new processing, such that the objective variable meets a desired condition.

Specifically, the basic parameter output part 94 operates to acquire the recipe during the new processing, accepted by the recipe acceptance part 81, and the monitored value of the at least one module M during a last processing (i.e., immediately prior to the new processing), stored in the monitored value storage part 84, to estimate the setup time period in the new processing. More specifically, the basic parameter output part 94 operates to acquire adjusted values of each basic parameter during a plurality of previous processings (e.g., during processing under the same recipe as that during the new processing, and during processing having a monitored value equal to or falling within a given range from that during the last processing); classify or evaluate setup time periods in a case where each of the adjusted values is input as the initial value during the new processing; and output a result of the classification/evaluation. Alternatively, in some embodiments, the basic parameter output part 94 may be configured to classify or evaluate setup time periods in a case where each of the initial values of each basic parameter during the plurality of previous processings is input as the initial value during the new processing, and output a result of the classification/evaluation.

In this case, the basic parameter output part 94 operates to acquire monitored values of each state parameter of the ion source system-module at the end of the last processing, specifically the adjusted value of each basic parameter and the filament voltage and filament current as the state parameters of the filament, during the last processing in the ion source system-module, and determine initial values of each basic parameter using the acquired monitored values. Alternatively, in some embodiments, the basic parameter output part 94 may be configured to acquire monitored values of each state parameter of an element of the ion source system-module other than the filament, the extraction electrode system-module, or the beam line electromagnetic field system-module, and determine initial values of each basic parameter using the acquired monitored values.

An initial value of a basic parameter is input in the new processing (S4). For example, among the initial values of each basic parameter, output from the basic parameter output part 94 in the above manner, one initial value determined, based on a given criterion, to be optimal, e.g., one initial value allowing the setup time period to become shortest, is input to the respective one of the module M through the basic parameter input part 82. In some embodiments, the determination of the initial value is performed by the basic parameter output part 94. Alternatively, in other embodiments, the determination may be performed by a computer (e.g., the control device 8) provided separately from the machine learning device 9, or may be performed by an operator.

The initial value of the basic parameter is adjusted (S5). For example, the adjustment of the initial value of each basic parameter may be performed by the basic parameter tuning part 83 as mentioned above, to complete the setup of the modules M.

In the ion beam irradiation apparatus 100 configured as above, the learning data includes the monitored value of each state parameter of the at least one module M in the last processing, so that it is possible to perform machine learning in consideration of the state of the at least one module M during last processing.

Therefore, by using a learning model generated by machine learning, it becomes possible to determine, during new processing, the initial value of each basic parameter, e.g., so as to allow the setup time period to become shortest.

Specifically, as a result of comparison between respective setup time periods in a case where the initial value of each basic parameter output from the machine learning device 9 is input to the respective one of the modules M and in a case where an existing parameter of each basic parameter in a related art apparatus is input to the respective one of the modules M, the setup time period in the ion beam irradiation apparatus 100 according to various embodiments was about one-half of that of a related art apparatus, which shows that the machine learning device 9 makes it possible to shorten the setup time period.

Among the plurality of modules M, the ion source system-module is often short in terms of usable life, and high in terms of maintenance or exchange frequency, as compared to the extraction electrode system-module and the beam line electromagnetic field system-module.

In this regard, the learning data may include the monitored value of each state parameter of at least the ion source system-module, so that it is possible to perform machine learning in consideration of the state of a last processing in the ion source whose state is likely to change, as compared with the remaining modules M, and adequately determine the initial value during new processing.

Further, the basic parameter of the ion source system-module may include the flow rate of gas to be supplied to the plasma chamber and the supply current to be supplied to the source magnet, each of which has a dominant influence on efficiency of the plasma generation, so that it becomes possible to adequately determine the initial value of each of the gas flow rate and the supply current to the source magnet, so as to efficiently generate plasma having difficulty in modeling.

Figure 5:
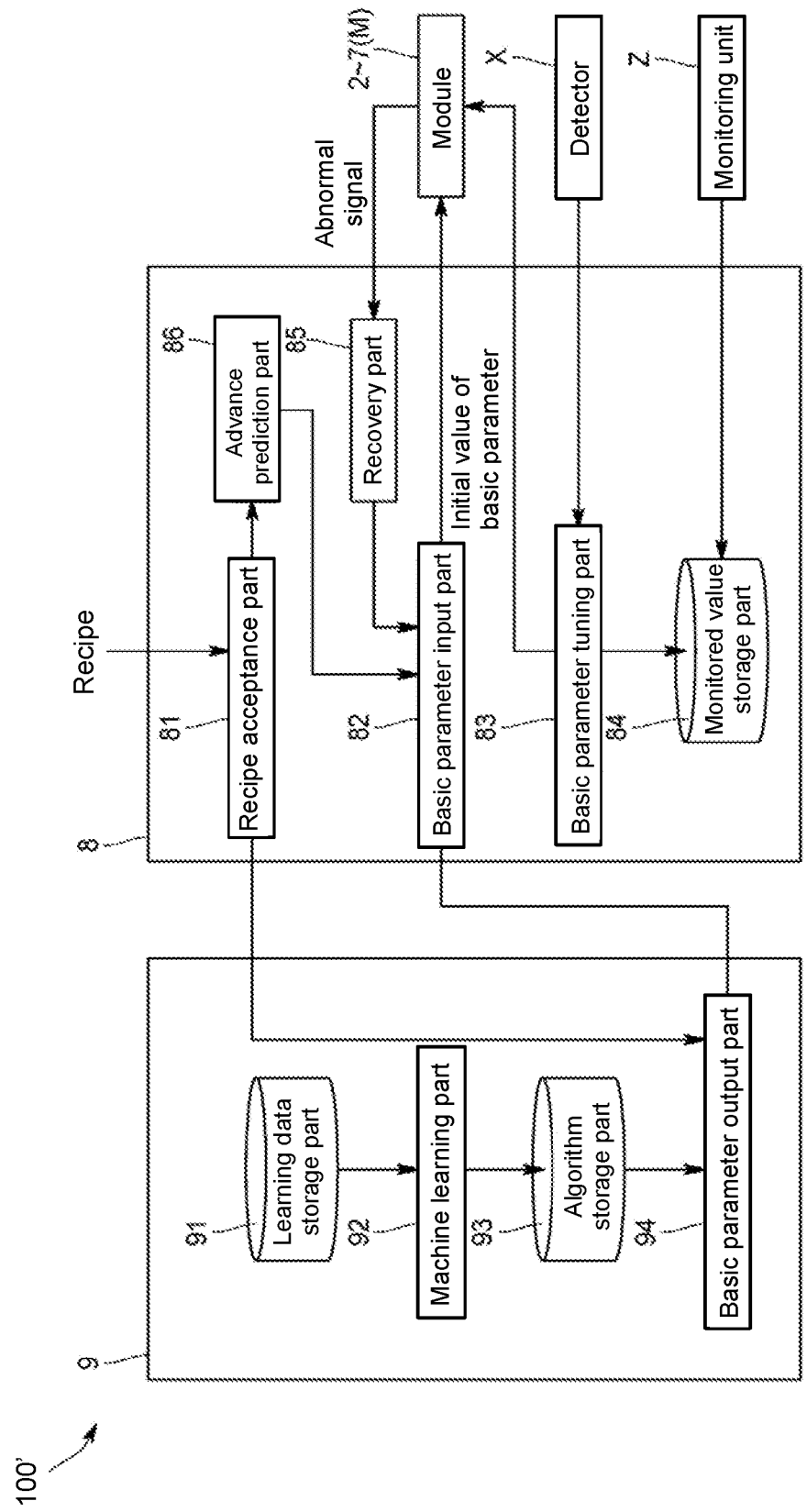
FIG. 5 is a functional block diagram showing functions of a control device and a machine learning device of an ion beam irradiation apparatus according to an embodiment.

FIG. 5 is a functional block diagram showing functions of a control device and a machine learning device of an ion beam irradiation apparatus according to an embodiment.

An ion beam irradiation apparatus 100' is different from the embodiment illustrated in FIGS. 1-4, in that the ion beam irradiation apparatus 100' is configured to switch between a first mode of operation in which an initial value of each basic parameter obtained based on a learning algorithm is input to a respective one of a plurality of modules M and adjusted, in the same manner as that in the embodiment illustrated in FIGS. 1-4 (the first mode will hereinafter be referred to as an "AI basic parameter mode"), and a second mode of operation in which an initial value of each basic parameter selected by a control device 8 without relying on the AI basic parameter mode is input to the respective one of the modules M and adjusted (the second mode will hereinafter be referred to as "BC basic parameter mode").

The operation of the AI basic parameter mode is described above with respect to FIGS. 1-4. Thus, only the BC basic parameter mode will be described below.

Examples of the BC basic parameter mode may include a related art setup sequence that is executed in the control device 8. Specifically, when a recipe acceptance part 81 is operable to accept a recipe, a basic parameter input part 82 operates to select, as the initial value of each basic parameter, an initial value preliminarily stored in a memory or the like according to each recipe, or an initial value used during previous processing under the same recipe as the accepted recipe, and input the selected initial value of each basic parameter to the respective one of the modules M.

Subsequently, a basic parameter tuning part 83 is operable to adjust the input initial value of each basic parameter such that an ion beam IB is generated in conformity to the recipe, thereby setting up the respective one of the modules M.

As shown in FIG. 5, the control device 8 may further include at least one of functions of a recovery part 85 or an advance prediction part 86.

The recovery part 85 is operable, when the setup of the modules M in the BC basic parameter mode is abnormally ended without being successfully completed, to acquire an abnormal signal indicative of that fact, and switch the module setup sequence from the BC basic parameter mode to the AI basic parameter mode.

Specifically, the recovery part 85 is operable, upon acquiring the abnormal signal, to switch the operation of the basic parameter input part 82 from the BC basic parameter mode to the AI basic parameter mode to cause the basic parameter input part 82 to re-input the initial value of each basic parameter to the respective one of the modules M. That is, the basic parameter input part 82 is operable to acquire the initial value of each basic parameter determined by a basic parameter output part 94 of a machine learning device 9 using a learning algorithm and outputted from the basic parameter output part 94, and input the acquired initial value of each basic parameter to the respective one of the modules M.

The recovery part 85 may be configured to, when the abnormal signal is still detected even after switching the operation of the basic parameter input part 82 from the BC basic parameter mode to the AI basic parameter mode, cause the basic parameter input part 82 to be operated in the AI basic parameter mode again. In this case, the basic parameter output part 94 is advantageously configured to output an initial value determined based on the state of an ion source system-module whose state is likely to change, as compared with the remaining modules M.

The advance prediction part 86 is operable, before start of the operation in the BC basic parameter mode, to predict, based on the recipe accepted by the recipe acceptance part 81, whether the setup of the modules M according to the BC basic parameter mode will be successfully completed.

Specifically, the advance prediction part 86 is operable to determine, e.g., whether or not one or more of the following phenomena occur, and, when one or more of the following phenomena are determined to occur, determine that the setup according to the BC basic parameter mode is highly probable to fail to be successfully completed.

Phenomenon 1: The same recipe as the accepted recipe has not be previously accepted for a given period of time (e.g., for one month).

Phenomenon 2: In processing one or more processing cycles before, under the same recipe as the accepted recipe, a given actual value (e.g., the beam current amplitude of the ion beam IB, the beam angle of the ion beam IB, and/or the beam current density of the ion beam IB) is out of a given numerical range. The given numerical range may be preset.

Phenomenon 3: In processing one or more processing cycles before, under the same recipe as the accepted recipe, the setup according to the BC basic parameter mode failed to be successfully completed.

Phenomenon 4: Processing one or more processing cycles before, under the same recipe as the accepted recipe, was performed once or a given numbers of times in a state exposed to the atmosphere.

When it is predicted that the setup of the modules M will be successfully completed according to the BC basic parameter mode (i.e., when none of the above described phenomena are determined to occur), the advance prediction part 86 is operable to cause the basic parameter input part 82 to be operated according to the BC basic parameter mode.

On the other hand, when it is predicted that the setup of the modules M will fail to be successfully completed according to the BC basic parameter mode (i.e., when at least one of the above-described phenomena is determined to occur), the advance prediction part 86 is operable to cause the basic parameter input part 82 to be operated according to the AI basic parameter mode.

In the ion beam irradiation apparatus according to the embodiment illustrated in FIG. 5, the BC basic parameter mode may be used for a recipe under which the setup could be completed within a relatively short period of time with respect to a past record, and the AI basic parameter mode may be used for a recipe under which it takes a relatively long period of time for completing the setup.

This makes it possible to introduce the setup operation based on the AI basic parameter mode without largely modifying an existing setup sequence, to achieve further shortening of the setup time period and further improvement in setup success rate, as compared with the related art apparatus.

Embodiments are not limited to the various embodiments described above.

For example, although the above embodiments have been described based on an example where the objective variable is the setup time period, the objective variable may be an index value indicative of whether or not the adjusted value is obtained, i.e., an index value indicative of whether or not the setup has been completed; the beam current amplitude of the ion beam IB; the beam angle of the ion beam IM; or the beam current density of the ion beam IB.

Further, the basic parameter output part 94 may be configured to output the initial value of each basic parameter, e.g., such that the setup time period falls within a given time period, and the quality of the ion beam IB, such as the beam current amplitude of the ion beam IB, the beam angle of the ion beam IM or the beam current density of the ion beam IB, meets a given condition.

The machine learning device 9 may have a function of an objective variable estimation part to estimate the objective variable (e.g., the setup time period) in new processing, based on the learning algorithm generated using the learning data.

The above embodiments have been described based on an example where the monitored value of each state parameter at the end of the last processing is used as the explanatory variable. Alternatively, the monitored value of each state parameter in the middle of the last processing may be used as the explanatory variable.

In some embodiments, the control device 8 may be configured to have a portion or all of the functions of the machine learning device 9.

The parts 81-86 and parts 91-94 described above may be implemented as program code that can be executed using various computer components and may be recorded on a computer readable storage medium. The computer readable storage medium may include a program command, a data file, a data structure, etc., alone or in combination. Examples of the computer readable storage medium may include magnetic storage media (e.g., hard disks, floppy disks, magnetic media such as magnetic tapes, etc.), optical recording media (e.g., CD-ROMs or DVDs), magneto-optical media (e.g., floptical disks), and hardware devices specifically configured to store and execute program commands (e.g., ROM, RAM, flash memories, etc.). Examples of the program code may include mechanical codes prepared by a compiler, and high-level languages executable by a computer by using an interpreter.

It should be understood that the present disclosure is not limited to the above embodiments, but various other changes and modifications may be made therein without departing from the spirit and scope thereof as set forth in appended claims.

What is claimed is:

1. An ion beam irradiation apparatus comprising:
a plurality of modules for generating an ion beam meeting a processing condition;
a memory storing program code; and
at least one central processing unit (CPU) which accesses the memory to read the program code and execute the program code to operate as:
a machine learning part that generates a learning algorithm using, as an explanatory variable, a processing condition during new processing and a monitored value that indicates a state of at least one of the modules during a last processing immediately before the new processing; and
a basic operation parameter output part that uses the learning algorithm to output an initial value of a basic operation parameter for controlling an operation of the at least one of the modules.

2. The ion beam irradiation apparatus as recited in claim 1, wherein the at least one CPU further executes the program code to input an initial value to one of the modules, and the one of the modules is operated based on an adjusted value obtained by adjusting the initial value,
wherein the CPU further executes the program code to operate as:
a learning data storage part that stores learning data obtained from a plurality of previous processings that are prior to the new processing, the learning data including a plurality of data sets, each data set including the processing condition used in the processing, at least one of the initial value or the adjusted value for at least one module in the processing, the monitored value of the at least one module during the last processing immediately before the processing, and an actual value of an objective variable that is measured in the processing associated with each other, and
wherein the learning algorithm is generated through machine learning using the learning data.

3. The ion beam irradiation apparatus as recited in claim 2, wherein the objective variable comprises a setup time period until the adjusted value is obtained; an index value indicative of whether or not the adjusted value is obtained; a beam current amplitude of the ion beam; a beam angle of the ion beam; or a beam current density of the ion beam.

4. The ion beam irradiation apparatus as recited in claim 2, wherein the plurality of modules include an ion source system-module, and
wherein the learning data includes the monitored value of at least the ion source system-module.

5. The ion beam irradiation apparatus as recited in claim 4, wherein the basic operation parameter comprises at least one of a flow rate of a gas to be supplied to a plasma chamber constituting the ion source-system module, or a current to be supplied to a source magnet for generating a magnetic field inside the plasma chamber.

6. The ion beam irradiation apparatus as recited in claim 1, which further comprises:
a control device comprising a memory storing control program code and at least one central processing unit (CPU) that accesses the memory to execute the control program code to:
based on the processing condition and a setup sequence, select an initial value of the basic operation parameter;
input the selected initial value to one of the modules; and
adjust the input initial value to setup the one of the modules.

7. The ion beam irradiation apparatus as recited in claim 6, wherein the at least one CPU of the control device further executes the control program code to operate as a recovery part that, when the setup of the one of the modules fails to be completed, acquire an abnormal signal indicative of the failure, and in response to the abnormal signal, input the initial value of the basic operation parameter output from the basic operation parameter output part to the one of the modules.

8. The ion beam irradiation apparatus as recited in claim 6, wherein the at least one CPU of the control device further executes the control program code to operate as an advance prediction part that, when using the initial value selected based on the processing condition and the setup sequence, predicts whether or not the setup of the one of the modules will be completed, and in response to the advance prediction part predicting that the setup of the one of the modules will not be completed, input the initial value of the basic operation parameter output from the basic operation parameter output part to the one of the modules.

9. A computer readable storage medium storing program code which, when executed by at least one central processing unit (CPU) of an ion beam irradiation apparatus that includes a plurality of modules for generating an ion beam meeting a processing condition, causes the CPU to operate as:

a machine learning part that generates a learning algorithm using, as an explanatory variable, a processing condition during new processing and a monitored value that indicates a state of at least one of the modules during a last processing immediately before the new processing; and a basic operation parameter output part that uses the learning algorithm to output an initial value of a basic operation parameter for controlling an operation of at least one of a plurality of modules for generating an ion beam meeting the processing condition.

* * * * *